US010928866B2

(12) United States Patent
Tiritilli et al.

(10) Patent No.: US 10,928,866 B2
(45) Date of Patent: Feb. 23, 2021

(54) UNIVERSAL LOW PROFILE TO FULL HEIGHT FORM FACTOR ADAPTER

(71) Applicant: Dell Products L.P., Round Rock, TX (US)

(72) Inventors: Troy A. Tiritilli, Round Rock, TX (US); John R. Palmer, Georgetown, TX (US); Phil R. Geiger, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/440,756

(22) Filed: Jun. 13, 2019

(65) Prior Publication Data
US 2020/0393878 A1 Dec. 17, 2020

(51) Int. Cl.
*H05K 7/00* (2006.01)
*G06F 1/18* (2006.01)
*G11B 33/02* (2006.01)
*H05K 7/14* (2006.01)
(Continued)

(52) U.S. Cl.
CPC .............. *G06F 1/185* (2013.01); *G06F 1/184* (2013.01); *G11B 33/02* (2013.01); *G11B 33/122* (2013.01); *G11B 33/124* (2013.01); *H05K 1/14* (2013.01); *H05K 7/1422* (2013.01); *H05K 7/00* (2013.01)

(58) Field of Classification Search
None
See application file for complete search history.

(56) References Cited

U.S. PATENT DOCUMENTS

| 5,383,793 | A | * | 1/1995 | Hsu | .................... | H05K 7/1405 |
| | | | | | | 248/316.4 |
| 5,996,962 | A | * | 12/1999 | Chang | .................... | G06F 1/184 |
| | | | | | | 248/694 |

(Continued)

*Primary Examiner* — Anthony Q Edwards
*Assistant Examiner* — Rashen E Morrison
(74) *Attorney, Agent, or Firm* — Jackson Walker L.L.P.

(57) ABSTRACT

A method comprising may include mechanically coupling a first main body to a second main body mechanically via a first mechanical feature such that distance between the first main body and the second main body is variable in a first direction, mechanically coupling a chassis engagement feature to the first main body via a second mechanical feature such that distance between the chassis engagement feature and the first main body is variable in a second direction perpendicular to the first direction, wherein the chassis engagement feature is configured to mechanically engage with a chassis when the information handling resource is engaged within the chassis, and mechanically coupling a card engagement feature to the first main body via a third mechanical feature such that distance between the card engagement feature and the first main body is variable in a third direction perpendicular to the first direction and the second direction, wherein the card management feature is configured to mechanically engage with the information handling resource at an edge of the information handling resource opposite of an edge connector of the information handling resource, such that when the information handling resource is engaged within the chassis, the adapter mechanically constrains movement of the information handling resource relative to the chassis.

15 Claims, 4 Drawing Sheets

(51) Int. Cl.
*G11B 33/12* (2006.01)
*H05K 1/14* (2006.01)

(56) References Cited

U.S. PATENT DOCUMENTS

| | | | | |
|---|---|---|---|---|
| 6,229,709 B1 * | 5/2001 | Hardt | ............... | G06F 1/184 |
| | | | | 361/752 |
| 6,361,343 B1 * | 3/2002 | Daskalakis | ............... | G06F 1/184 |
| | | | | 439/327 |
| 6,885,565 B2 * | 4/2005 | Shi | ............... | G06F 1/184 |
| | | | | 361/732 |
| 7,140,900 B1 * | 11/2006 | Villanueva | ............... | H05K 7/1431 |
| | | | | 439/327 |
| 7,149,094 B2 * | 12/2006 | Li | ............... | H05K 7/142 |
| | | | | 361/801 |
| 7,310,237 B2 * | 12/2007 | McEwan | ............... | H01R 13/639 |
| | | | | 361/610 |
| 7,440,293 B2 * | 10/2008 | Hood, III | ............... | G06F 1/184 |
| | | | | 361/807 |
| 7,646,592 B2 * | 1/2010 | McCormick | ............... | G06F 1/183 |
| | | | | 361/679.02 |
| 8,100,484 B2 * | 1/2012 | Wu | ............... | G06F 1/181 |
| | | | | 312/223.2 |
| 8,289,690 B2 * | 10/2012 | Chang | ............... | G06F 1/186 |
| | | | | 361/679.32 |
| 8,553,424 B2 * | 10/2013 | Chiang | ............... | H05K 7/1408 |
| | | | | 361/759 |
| 8,733,720 B2 * | 5/2014 | Wilkinson | ............... | G09F 17/00 |
| | | | | 248/218.4 |
| 9,471,113 B2 * | 10/2016 | Fan | ............... | G06F 1/186 |
| 9,765,924 B2 * | 9/2017 | Chi | ............... | G06F 1/20 |
| 9,927,834 B2 * | 3/2018 | Hua | ............... | H01R 12/721 |
| 9,939,856 B1 * | 4/2018 | Wu | ............... | F16B 1/00 |
| 2004/0257784 A1 * | 12/2004 | Dalisay | ............... | H05K 7/1409 |
| | | | | 361/801 |
| 2006/0109636 A1 * | 5/2006 | Hood, III | ............... | G06F 1/185 |
| | | | | 361/792 |
| 2007/0004264 A1 * | 1/2007 | Brown | ............... | G06F 1/185 |
| | | | | 439/351 |
| 2009/0067136 A1 * | 3/2009 | Cheney | ............... | H05K 7/1431 |
| | | | | 361/726 |
| 2013/0135813 A1 * | 5/2013 | Jimenez, III | ............... | G06F 1/185 |
| | | | | 361/679.32 |
| 2017/0191610 A1 * | 7/2017 | Chi | ............... | F16M 13/02 |

* cited by examiner

UNIVERSAL LOW PROFILE TO FULL HEIGHT FORM FACTOR ADAPTER

TECHNICAL FIELD

The present disclosure relates in general to information handling systems, and more particularly to systems and methods for providing a universal low profile to full height form factor adapter for information handling system components.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Increasingly, information handling systems are making use of low-profile components, such as low-profile Peripheral Component Interconnect Express (PCIe) devices, instead of larger "full-height" devices. Such low-profile components may render such components capable of accepting lower cooling airflow requirements relative to their full-height counterparts while still maintaining thermal capabilities. However, by making the form factor of such devices smaller, such devices have also become heavier due to increased densities and increased sizes of heatsinks thermally coupled to the devices. In turn, it is increasingly difficult to retain the printed circuit board cards used to implement such devices, and accordingly, these cards are harder to retain in place (e.g., remain mechanically and electrically coupled to a riser card), in response to mechanical shock and vibrations to the information handling system in which the card is disposed. While some retention mechanisms have been developed, such mechanisms render it difficult for a user to easily insert and remove a card.

SUMMARY

In accordance with the teachings of the present disclosure, the disadvantages and problems associated with existing approaches to disposing information handling system components within an information handling system may be reduced or eliminated.

In accordance with embodiments of the present disclosure, a form factor adapter for use with an information handling resource may include a first main body, a second main body mechanically coupled to the first main body via a first mechanical feature such that distance between the first main body and the second main body is variable in a first direction, a chassis engagement feature mechanically coupled to the first main body via a second mechanical feature such that distance between the chassis engagement feature and the first main body is variable in a second direction perpendicular to the first direction, wherein the chassis engagement feature is configured to mechanically engage with a chassis when the information handling resource is engaged within the chassis, and a card engagement feature mechanically coupled to the first main body via a third mechanical feature such that distance between the card engagement feature and the first main body is variable in a third direction perpendicular to the first direction and the second direction, wherein the card management feature is configured to mechanically engage with the information handling resource at an edge of the information handling resource opposite of an edge connector of the information handling resource, such that when the information handling resource is engaged within the chassis, the adapter mechanically constrains movement of the information handling resource relative to the chassis.

In accordance with these and other embodiments of the present disclosure, an information handling system may include at least one information handling resource and a form factor adapter. The form factor adapter may include a first main body, a second main body mechanically coupled to the first main body via a first mechanical feature such that distance between the first main body and the second main body is variable in a first direction, a chassis engagement feature mechanically coupled to the first main body via a second mechanical feature such that distance between the chassis engagement feature and the first main body is variable in a second direction perpendicular to the first direction, wherein the chassis engagement feature is configured to mechanically engage with a chassis when the information handling resource is engaged within the chassis, and a card engagement feature mechanically coupled to the first main body via a third mechanical feature such that distance between the card engagement feature and the first main body is variable in a third direction perpendicular to the first direction and the second direction, wherein the card management feature is configured to mechanically engage with the information handling resource at an edge of the information handling resource opposite of an edge connector of the information handling resource, such that when the information handling resource is engaged within the chassis, the adapter mechanically constrains movement of the information handling resource relative to the chassis.

In accordance with these and other embodiments of the present disclosure, a method may include mechanically coupling a first main body to a second main body mechanically via a first mechanical feature such that distance between the first main body and the second main body is variable in a first direction, mechanically coupling a chassis engagement feature to the first main body via a second mechanical feature such that distance between the chassis engagement feature and the first main body is variable in a second direction perpendicular to the first direction, wherein the chassis engagement feature is configured to mechanically engage with a chassis when the information handling resource is engaged within the chassis, and mechanically coupling a card engagement feature to the first main body via a third mechanical feature such that distance between the card engagement feature and the first main body is variable in a third direction perpendicular to the first direction and the second direction, wherein the card management feature is configured to mechanically engage with the information handling resource at an edge of the information handling resource opposite of an edge connector of the information handling resource, such that when the information handling resource is engaged within the chassis, the adapter mechanically constrains movement of the information handling resource relative to the chassis.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
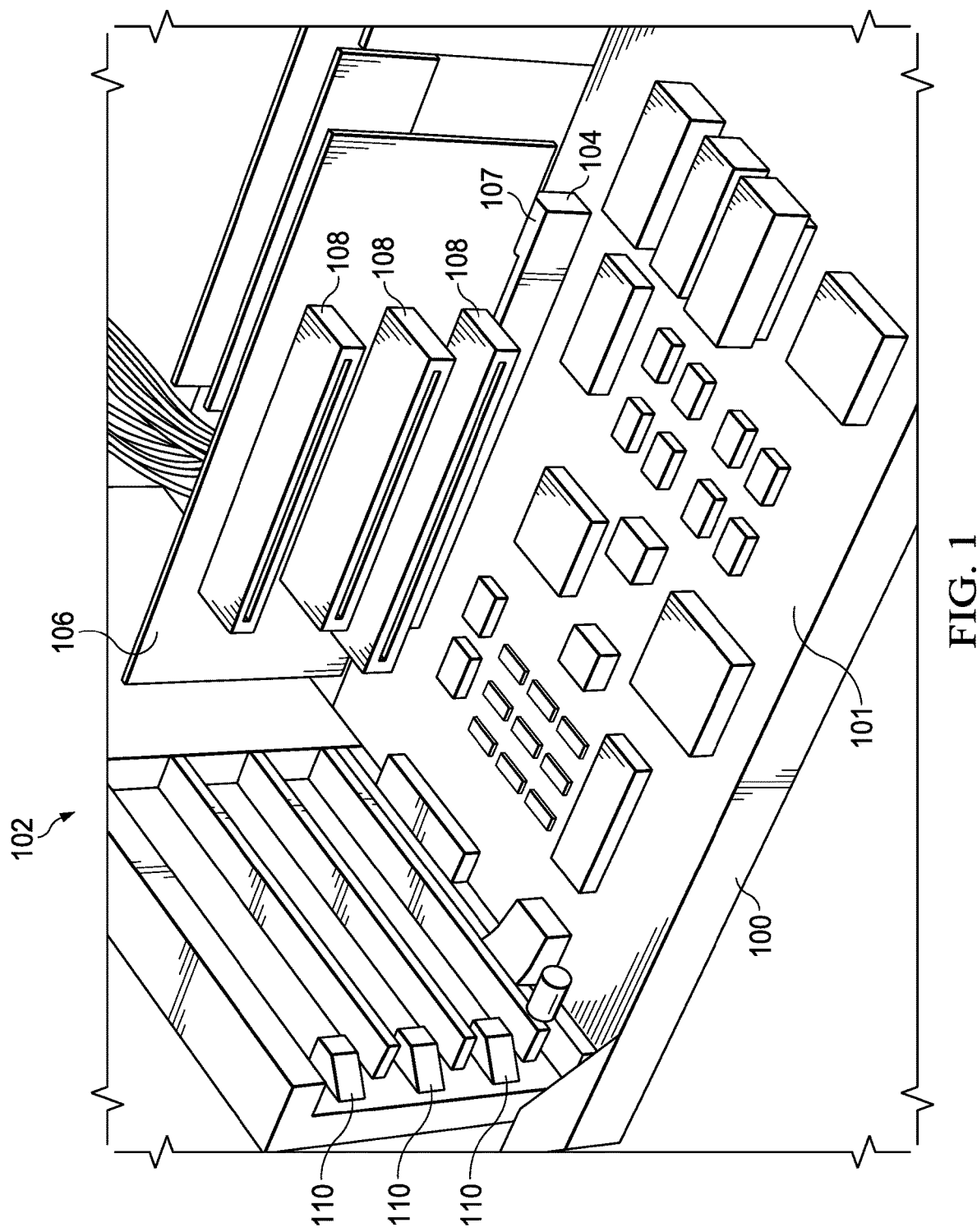
FIG. 1 illustrates an isometric perspective view of an example information handling system, in accordance with embodiments of the present disclosure.
Figure 2A:
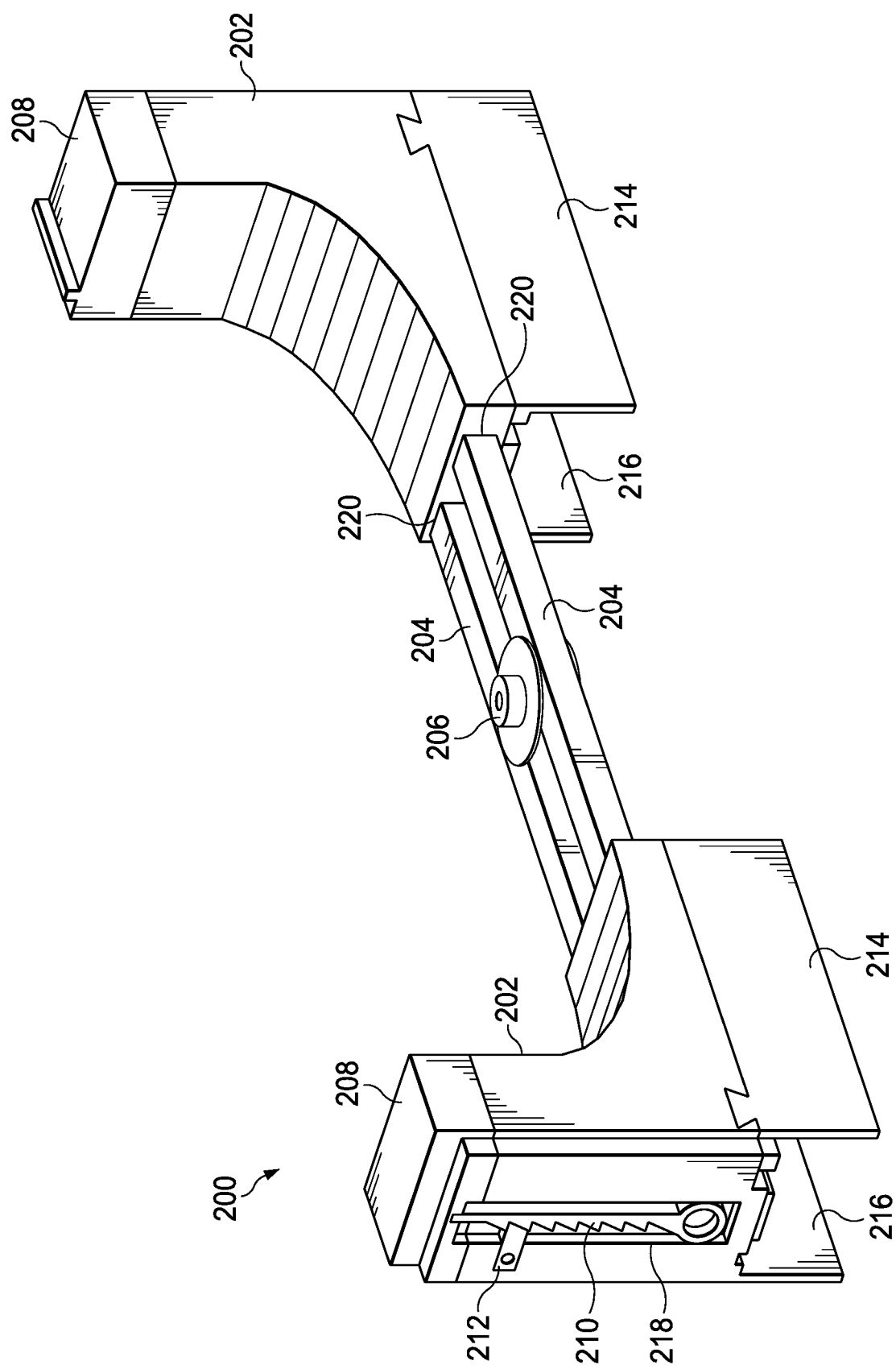
FIGS. 2A and 2B each illustrate isometric perspective views of an example low profile to full height form factor adapter for use with an information handling resource, in accordance with embodiments of the present disclosure.
Figure 2B:
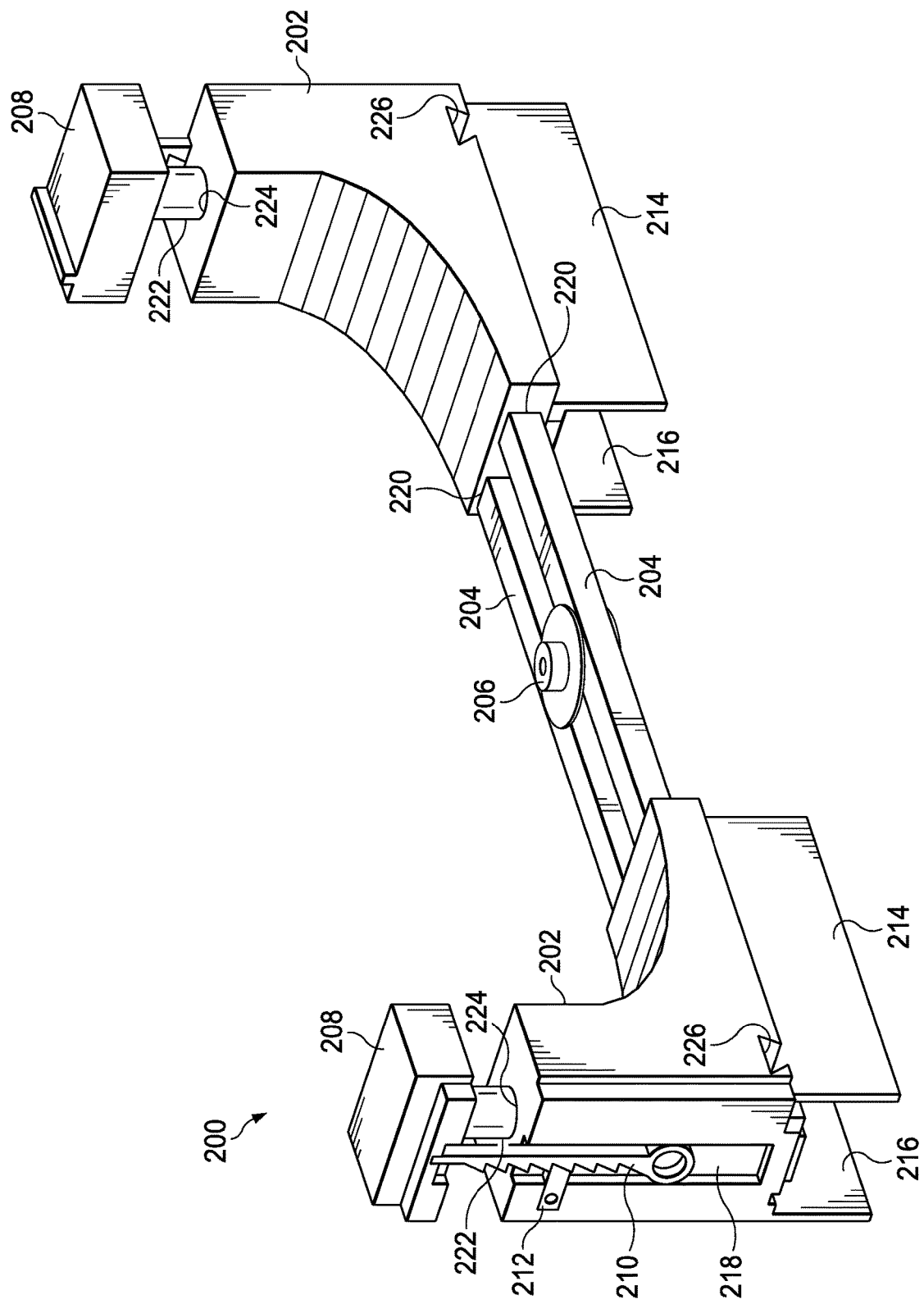
Figure 3:
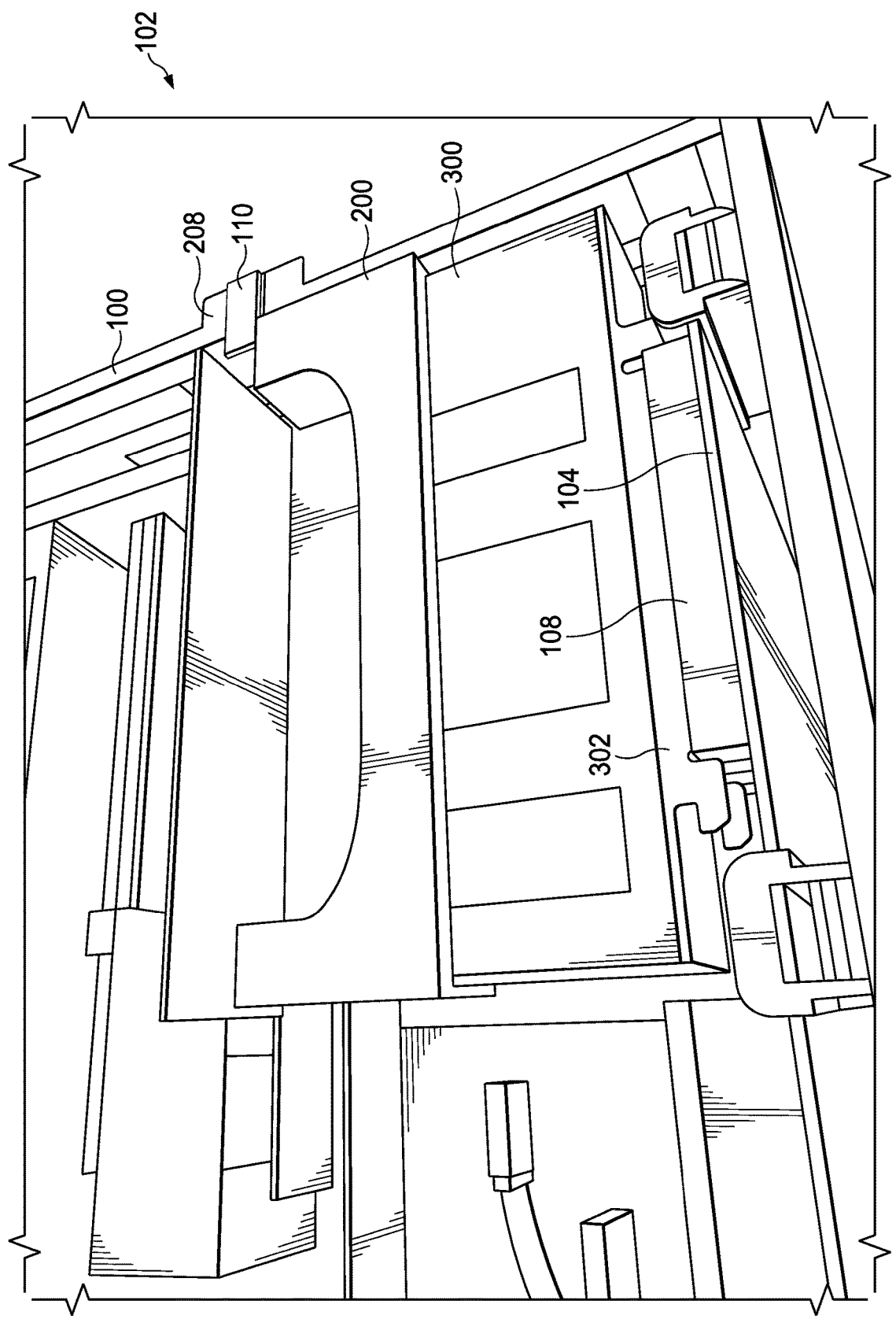
FIG. 3 illustrates an isometric perspective view of an example information handling system with an information handling resource engaged with an example low profile to full height form factor adapter and disposed in the information handling system, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal data assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, power supplies, air movers (e.g., fans and blowers) and/or any other components and/or elements of an information handling system.

FIG. 1 illustrates an isometric perspective view of an example information handling system 102, in accordance with embodiments of the present disclosure. As depicted, information handling system 102 may include a chassis 100, a motherboard 101, a riser card 106 mechanically and communicatively coupled to motherboard 101, and one or more other information handling resources.

Chassis 100 may be an enclosure that serves as a container for various information handling resources, and may be constructed from steel, aluminum, plastic, and/or any other suitable material. Although the term "chassis" is used, chassis 100 may also be referred to as a sled, case, cabinet, tower, box, enclosure, and/or housing.

Motherboard 101 may include a circuit board mechanically coupled to chassis 100 (e.g., via screws, fasteners, and/or any other mechanical mechanism) and configured to provide structural support for one or more information handling resources of information handling system 102 and/or electrically couple one or more of such information handling resources to each other and/or to other electric or electronic components external to information handling system 102. For example, motherboard 101 may include one or more processors, one or more memories, and one or more other information handling resources. As a specific example, motherboard 101 may have mounted thereon a receptacle connector 104 having mechanical features (e.g., a rigid plastic bracket) and electrically-conductive features (e.g., pins) for receiving a corresponding edge connector (e.g., edge connector 107 of riser card 106), thus electrically coupling electrically conductive traces (e.g., pins) of the edge connector to corresponding electrically-conductive features of receptacle connector 104 and mechanically coupling an information handling resource (e.g., riser 108) to receptacle connector 104 in order to maintain such electrical coupling such that the information handling resource is electrically and communicatively coupled to motherboard 101.

Riser card 106 may comprise a printed circuit board configured to receive a multitude of signal lines (e.g., bused signal lines) via a single connector (e.g., edge connector 107) from motherboard 101 and distribute such signals lines via dedicated connectors (e.g., receptacle connectors 108) mounted on riser card 106. Thus, riser card 106 may enable the addition of expansion cards (e.g., PCIe cards), particularly where a height of chassis 100 does not allow for a perpendicular placement of expansion cards. As shown in FIG. 1, riser card 106 may plug into motherboard 101 (e.g., via edge connector 107) and may provide additional slots, via receptacle connector 108 mounted to riser card 106, for one or more other information handling resources (e.g., PCIe and/or other adapter cards). Accordingly, each receptacle connectors 108 may be configured to receive a corresponding edge connector of an information handling resource (e.g., PCIe and/or other adapter card). Consequently, riser card 106 may enable coupling of additional information handling resources in an orientation parallel to motherboard 101, which may save space within chassis 100.

As also depicted in FIG. 1, chassis 100 may comprise one or more card retention features 110 (e.g., latches, mechanical loading features, etc.) each configured to mechanically engage with an information handling resource disposed in a receptacle connector 108 of riser card 106 in order to assist (e.g., along with the receptacle connector 108) in mechanically constraining movement of such information handling resource, in order to ensure proper electrical coupling of such information handling resource to motherboard 101.

In addition to motherboard 101 and riser card 106, information handling system 102 may include one or more other information handling resources.

FIGS. 2A and 2B each illustrate isometric perspective views of an example low profile to full height form factor adapter 200 for use with an information handling resource, in accordance with embodiments of the present disclosure. FIGS. 2A and 2B depict various features of adapter 200 in different variable positions.

As shown in FIGS. 2A and 2B, adapter 200 may include two opposing main bodies 202 mechanically coupled to one another via variable-length adjustment arms 204. Accordingly, one or both of main bodies 202 may include openings 220 corresponding in size and shape to variable-length adjustment arms 204, such that a distance between main bodies 202 may be varied in a first direction by sliding variable-length adjustment arms 204 in and out of such openings. As also shown in FIGS. 2A and 2B, each main body 202 may have coupled thereto a chassis engagement feature 208. Each chassis engagement feature 208 may be mechanically coupled to a respective main body 202 in a manner that a distance of chassis engagement feature 208 may be varied in a second direction perpendicular to the first direction by sliding a post 222 in and out of an opening 224 of such respective main body 202, wherein such opening 224 corresponds in size and shape to such post 222. Adapter 202 may also include a clamp 206 that may be loosened to vary main bodies 202 relative to one another and tightened to fix the distance of main bodies 202 from one another.

In addition, each main body 202 may have a groove 218 formed therein configured to receive a corresponding ratcheting feature 210 of chassis engagement feature 208. Ratcheting feature 210 may include a number of slanted teeth or similar mechanical features that may, as distance between chassis engagement feature 208 and main body 202 increases, engage with a latch 212 coupled to main body 202 in order to "ratchet" to prevent decrease in distance between chassis engagement feature 208, with such decrease in distance enabled by disengaging latch 212 from ratcheting feature 210.

As further shown in FIGS. 2A and 2B, each main body 202 may have a feature 226 that may mechanically couple to a a width-adjustment feature 214, such that each width-adjustment feature 214 may be varied relative to a corresponding flange 216 of main body 202 in a third direction perpendicular to both the first direction and the second direction. As shown in FIGS. 2A and 2B, flange 216 may be similar in size and shape to width-adjustment feature 214.

In operation, the various features of adapter 200 may be varied in order to adapt a form factor of an information handling resource to a chassis in which it is desired to insert the information handling resource. For example, a user may adjust the distance between each width-adjustment feature 214 and its corresponding flange 216 based on a width or thickness of the information handling resource, such that adapter 200 may mechanically couple to an edge of the information handling resource opposite of an edge connector of the information handling resource. As a further example, the user may also adjust the distance between main bodies 202 based on geometry of a chassis in which it is desired to insert the information handling resource, and/or based on a length of the information handling resource, and may further adjust the distances of chassis engagement feature 208 relative to main bodies 202, such that when the information handling resource is engaged with a receptacle connector, chassis engagement features 208 interact with mechanical features of a chassis (e.g., one or more card retention features 110 of chassis 100) to mechanically constrain movement of the information handling resource relative to the receptacle connector and the chassis.

FIG. 3 illustrates an isometric perspective view of example information handling system 102 with an information handling resource 300 engaged with example low profile to full height form factor adapter 200 and disposed in information handling system 102, in accordance with embodiments of the present disclosure.

As shown in FIG. 3, when the various adjustable components of adapter 200 are configured based on the form factor of information handling resource 300 and the dimensions of components of chassis 100, adapter 200 may mechanically engage with information handling resource 300 such that chassis engagement features 208 of adapter 200 mechanically engage with one or more card retention features 110 (e.g., latches, mechanical loading features, etc.) of chassis 100, thus maintaining an edge connector 302 of information handling resource 300 within a corresponding receptacle connector 108 of riser card 106, and constraining movement of information handling resource 300 relative to chassis 100 to prevent information handling resource 300 from becoming disengaged from receptacle connector 108 in response to mechanical shock to chassis 100 (e.g., drop of chassis 100 and/or presence of vibrational energy)

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A form factor adapter for attaching to an information handling resource of an information handling system, the form factor adapter comprising: a pair of opposing main bodies, including a first main body, a second main body, and a variable displacement arm connected between the first main body and the second main body such that a distance between the first main body and the second main body is variable in a first direction corresponding to a length of the information handling resource: a card engagement feature, mechanically coupled to the first main body, wherein the card engagement figure defines a channel configured to mechanically engage with the information handling resource at an edge of the information handling resource opposite of an edge connector of the information handling resource wherein the width of the channel is variable in a second direction perpendicular to the first direction, wherein the second direction corresponds to a thickness of the information handling resource; and a chassis engagement feature attached to a post configured to be received in an opening of the first main body wherein the post is configured to slide within the opening such that a distance between the chassis engagement feature and the first main body is variable in a third direction perpendicular to the first direction and the second direction, wherein the third direction corresponds to a height of the information handling resource and wherein the chassis engagement feature is configured to mechanically engage with a chassis feature of the information handling system when the information handling resource is, received in the card engagement feature and an edge connect of the information handling resource is connected to a receptacle connector on a riser card of the information handling system, such that the adapter mechanically constrains movement of the information handling resource relative to the chassis.

2. The form factor adapter of claim 1, further comprising a second chassis engagement feature attached to a post configured to be received in an opening of the second main body wherein the post is configured to slide within the opening such that a distance between the second chassis engagement feature and the first main body is variable in the third direction and wherein the second chassis engagement feature is configured to mechanically engage with a chassis feature of the information handling system when the information handling resource is received in the card engagement feature and an edge connect of the information handling resource is connected to a receptacle connector on a riser card of the information handling system.

3. The form factor adapter of claim 1, further comprising a second card engagement feature mechanically coupled to the second main body, wherein the second card engagement figure defines a second channel configured to mechanically engage with the information handling resource at the edge of the information handling resource opposite of the edge connector wherein the width of the second channel is variable in a second direction, perpendicular to the first direction.

4. The form factor adapter of claim 1, wherein the first main body and the second main body are mechanically coupled to one another via two variable-length adjustment arms.

5. The form factor adapter of claim 1, wherein the first main body includes a groove formed therein configured to receive a ratcheting feature of the chassis engagement feature, wherein the ratcheting feature is configured to engage with a latch coupled to the first main body as distance between the chassis engagement feature and the first main body increases to prevent decrease in distance between the chassis engagement feature and the first main body.

6. An information handling system comprising:
an information handling resource; and
a form factor adapter, comprising:
a pair of opposing main bodies, including a first main body, a second main body, and a variable displacement arm connected between the first main body and the second main body such that a distance between the first main body and the second main body is variable in a first direction corresponding to a length of the information handling resource;
a card engagement feature, mechanically coupled to the first main body, wherein the card engagement figure defines a channel configured to mechanically engage with the information handling resource at an edge of the information handling resource opposite of an edge connector of the information handling resource wherein the width of the channel is variable in a second direction, perpendicular to the first direction, wherein the second direction corresponds to a thickness of the information handling resource; and a chassis engagement feature attached to a post configured to be received in an opening of the first main body wherein the post is configured to slide within the opening such that a distance between the chassis engagement feature and the first main body is variable in a third direction perpendicular to the first direction and the second direction, wherein the third direction corresponds to a height of the information handling resource and wherein the chassis engagement feature is configured to mechanically engage with a chassis feature of the information handling system when the information handling resource is received in the card engagement feature and an edge connect of the information handling resource is connected to a receptacle connector on a riser card of the information handling system, such that the adapter mechanically constrains movement of the information handling resource relative to the chassis.

7. The information handling system of claim 6, the form factor adapter further comprising a second chassis engagement feature attached to a post configured to be received in an opening of the second main body wherein the post is configured to slide within the opening such that a distance between the second chassis engagement feature and the first main body is variable in the third direction and wherein the second chassis engagement feature is configured to mechanically engage with a chassis feature of the information handling system when the information handling resource is received in the card engagement feature and an edge connect of the information handling resource is connected to a receptacle connector on a riser card of the information handling system.

8. The information handling system of claim 6, the form factor adapter further comprising a second card engagement feature mechanically coupled to the second main body, wherein the second card engagement figure defines a second channel configured to mechanically engage with the information handling resource at the edge of the information handling resource opposite of the edge connector wherein the width of the second channel is variable in a second direction, perpendicular to the first direction.

9. The information handling system of claim 6, wherein the first main body and the second main body are mechanically coupled to one another via two variable-length adjustment arms.

10. The information handling system of claim 6, wherein the first main body includes a groove formed therein configured to receive a ratcheting feature of the chassis engagement feature, wherein the ratcheting feature is configured to engage with a latch coupled to the first main body as distance between the chassis engagement feature and the first main body increases to prevent decrease in distance between the chassis engagement feature and the first main body.

11. A method comprising: providing a pair of opposing main bodies, including a first main body, a second main body, and a variable displacement arm connected between the first main body and the second main body such that a distance between the first main body and the second main body is variable in a first direction corresponding to a length of an information handling resource; mechanically coupling a card engagement feature to the first main body, wherein the card engagement figure defines a channel configured to mechanically engage with the information handling resource at an edge of the information handling resource opposite of an edge connector of the information handling resource wherein the width of the channel is variable in a second direction, perpendicular to the first direction, wherein the second direction corresponds to a thickness of the information handling resource; and receiving a post attached to a chassis engagement feature in an opening of the first main body wherein the post k configured to slide within the opening such that a distance between the chassis engagement feature and the first main body k variable in a third direction perpendicular to the first direction and the second direction, wherein the third direction corresponds to a height of the information handling resource and wherein the chassis engagement feature is configured to mechanically engage with a chassis feature of an information handling system when the information handling resource is received in the card engagement feature and an edge connect of the information handling resource is connected to a receptacle connector on a riser card of the information handling system, such that the adapter mechanically constrains movement of the information handling resource relative to the chassis.

12. The method of claim 11, further comprising receiving a post attached to a second chassis engagement feature in an opening of the second main body wherein the post is configured to slide within the opening such that a distance between the second chassis engagement feature and the first main body is variable in the third direction and wherein the second chassis engagement feature is configured to mechanically engage with a chassis feature of the information handling system when the information handling resource is received in the card engagement feature and an edge connect of the information handling resource is connected to a receptacle connector on a riser card of the information handling system.

13. The method of claim 11, further comprising mechanically coupling a second card engagement feature to the second main body, wherein the second card engagement figure defines a second channel configured to mechanically engage with the information handling resource at the edge of the information handling resource opposite of the edge connector wherein the width of the second channel is variable in a second direction, perpendicular to the first direction.

14. The method of claim 11, further comprising mechanically coupling the first main body and the second main body to one another via two variable-length adjustment arms.

15. The method of claim 11, wherein the first main body includes a groove formed therein configured to receive a ratcheting feature of the chassis engagement feature, wherein the ratcheting feature is configured to engage with a latch coupled to the first main body as distance between the chassis engagement feature and the first main body increases to prevent decrease in distance between the chassis engagement feature and the first main body.

* * * * *